(12) United States Patent
Shive

(10) Patent No.: US 6,485,992 B1
(45) Date of Patent: Nov. 26, 2002

(54) PROCESS FOR MAKING WAFERS FOR ION IMPLANTATION MONITORING

(75) Inventor: Larry W. Shive, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/989,200

(22) Filed: Nov. 21, 2001

Related U.S. Application Data

(60) Provisional application No. 60/302,907, filed on Jul. 3, 2001.

(51) Int. Cl.[7] .............................................. H01L 21/66
(52) U.S. Cl. ........................................... 438/14; 438/15
(58) Field of Search .............................. 438/14, 15, 16, 438/780, 785, 629

(56) References Cited

U.S. PATENT DOCUMENTS

| | | | | | |
|---|---|---|---|---|---|
| 5,202,574 | A | * | 4/1993 | Fu et al. ....................... | 257/215 |
| 5,801,084 | A | * | 9/1998 | Beasom et al. ...... | 148/DIG. 12 |
| 5,849,627 | A | * | 12/1998 | Linn et al. ........... | 148/DIG. 12 |
| 5,907,188 | A | * | 5/1999 | Nakajima et al. ........... | 257/751 |
| 6,060,403 | A | * | 5/2000 | Yasuda et al. .............. | 438/765 |
| 6,133,150 | A | * | 10/2000 | Nakajima et al. ........... | 438/694 |
| 6,249,026 | B1 | * | 6/2001 | Matsumoto et al. ......... | 257/349 |
| 6,326,318 | B1 | * | 12/2001 | Watanabe et al. ........... | 438/780 |

\* cited by examiner

*Primary Examiner*—John F. Niebling
*Assistant Examiner*—Olivia Luk
(74) *Attorney, Agent, or Firm*—Senniger, Powers, Leavitt & Roedel

(57) ABSTRACT

A process is disclosed for making a silicon wafer with low and uniform surface stress by growing at least approximately 8 angstroms of silicon oxide thereon to produce a wafer for use as a control wafer in ion implantation. The process involves the steps of (a) subjecting a feed wafer substantially free of oxide or having less than approximately 4 angstroms of silicon oxide thereon to hydrogen termination of the silicon surface; or (b) subjecting such a feed wafer to said hydrogen termination followed by subjecting the resulting wafer to treatment with an oxidant having a standard reduction potential less than approximately 1.77 volts; the wafer resulting from either step (a) or (b) having a TWO reading less than approximately 30 across the entire wafer.

33 Claims, 1 Drawing Sheet

PROCESS FOR MAKING WAFERS FOR ION IMPLANTATION MONITORING

BACKGROUND OF THE INVENTION

This invention relates to a process for making silicon wafers and, more particularly, to such a process which produces silicon wafers with low and uniform surface stress for use as control wafers to be used in ion implantation.

Un-patterned, bare silicon wafers are used by device manufacturers to monitor and control their ion implantation tools. The monitoring procedure involves the following steps: 1) measuring the pre-implantation stress in the witness or control wafer using laser modulated thermal reflectivity; 2) implanting the wafer with ion dosage; 3) measuring the post-implant stress; and 4) using the delta (post-pre) measurement to determine the implant dosage. This method works very well for high dosage implants. However, for low dosage implants, the high variability, both wafer-to-wafer and within-wafer, of the pre-implant stress signal, increases the uncertainty of the measurement significantly. It had been thought that the wafer-to-wafer and within-wafer variability of the stress was caused by residual lattice damage caused by slicing, grinding, lapping and polishing or just uncertainty of the measurement.

In most cases, this has been determined not to be so. Rather, the chemical films that are formed on wafers during post-polish cleaning or post-Epi processing are the primary source of stress in the front surface silicon lattice. Control of these films allows one to control the lattice stress to low and uniform values that are preferred for control or witness wafers used in ion implantation.

The Themaprobe TP420 (made by Therma-Wave of Fremont, Calif.) is one instrument commonly used in the industry to measure laser modulated thermal reflectivity of ion implanted wafers. The "TW30" and "TW0" signals are both measures of residual stress in silicon. For example, TW30 of a wafer before ion implantation may read 100 TW30 units; then, after a 100 keV/W11 ions/cm^2 implantation may read 300 TW30 units. In this example, the post-implant signal is only 3 times greater than the pre-implant signal. This problem becomes worse for lower dose and lower energy implants (Kirby et al., Nuclear Instruments and Methods in Physics Research B21, 550, 1987). It is therefore highly desirable to have an implant witness wafer that has an initial TW signal that is <30 TW and that is very uniform.

Silicon wafer makers are currently selling wafers with one of three types of surface finishes: SCl oxides, ozone oxides or post Epi air oxides. All three of these oxides have problems with respect to TW. The SCl oxides and ozone oxides have TW30 signals that are 100 and 300, respectively. And, an Epi wafer that doesn't have an intentionally grown chemical oxide has regions of low TW30 (<30) and high TW30 (>>30).

There is a need, therefore, for a process for making a silicon wafer having a TW0 reading less than approximately 30 across the entire wafer.

SUMMARY OF THE INVENTION

Among the several objects of the invention may be noted the provision of a novel process for making a silicon wafer with low and uniform surface stress; the provision of such a process in which a wafer is hydrogen terminated or hydrogen terminated and oxidized with an oxidant having a standard reduction potential less than approximately 1.77 volts; the provision of such a process in which the feed wafer is a wafer with a freshly grown epitaxial layer or a wafer freshly stripped of oxide; and the provision of such a process which produces a wafer with at least 8 angstroms of silicon oxide thereon. Other objects and features will be in part apparent and in part pointed out hereinafter.

Briefly, the present invention is directed to a process for making a silicon wafer with low and uniform surface stress by growing at least approximately 8 angstroms of silicon oxide thereon to produce a wafer for use as a control wafer in ion implantation, which method comprises the steps of:

(a) subjecting a feed wafer substantially free of oxide or having less than approximately 4 angstroms of silicon oxide thereon to hydrogen termination of the silicon surface; or (b) subjecting such a feed wafer to said hydrogen termination followed by subjecting the resulting wafer to treatment with an oxidant having a standard reduction potential less than approximately 1.77 volts; the wafer resulting from either step (a) or (b) having a TW0 reading less than approximately 30 across the entire wafer.

DESCRIPTION OF THE PREFERRED EMBODIMENTS

Figure 1:
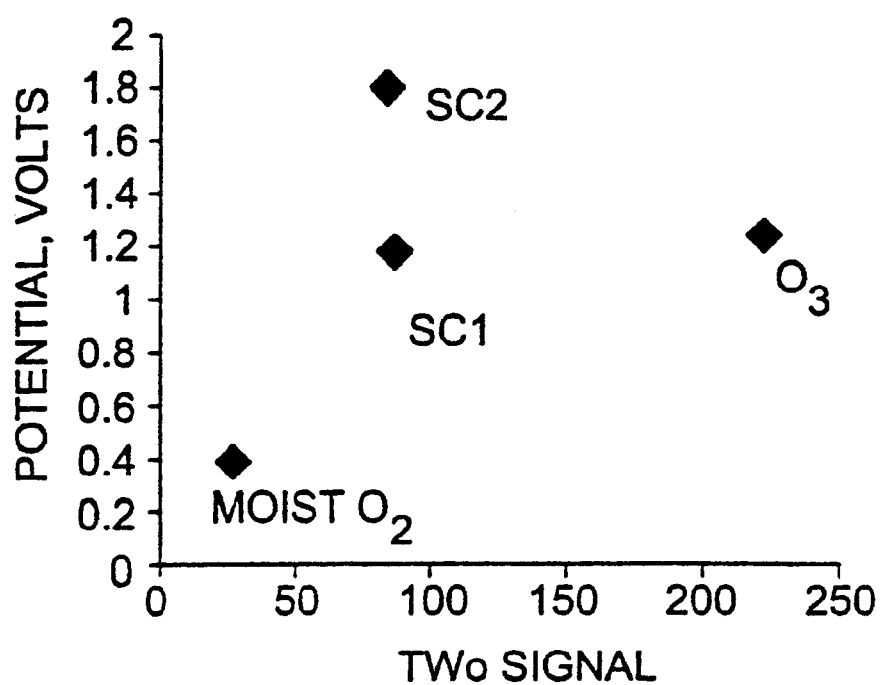
FIG. 1 is a graph showing the TW0 signal as a function of the oxidation potential of various oxidants.

In accordance with the present invention, it has now been found that silicon wafers with low and uniform surface stress for use as control wafers to be used in ion implantation may be produced by a process involving hydrogen termination of the silicon surface of the wafer or a process involving such hydrogen termination followed by oxidation of the wafer with a chemical oxidant having a standard reduction potential less than approximately 1.77 volts. In order to achieve the lowest possible near-surface stress, a wafer should be hydrogen terminated or hydrogen terminated and oxidized in an oxidant with the lowest possible oxidation potential. This results in a wafer with low and uniform surface stress by growing at least approximately 8 angstroms of silicon oxide thereon. Since hydrogen terminated silicon surfaces are not as stable as oxidized silicon surfaces, the latter are preferred in the practice of the invention.

The feed wafer in the several embodiments of the invention is a wafer with a freshly grown epitaxial silicon layer or that has been freshly stripped of oxide to have less than approximately 4 angstroms of silicon oxide thereon using agents such as aqueous HF, ammonium hydroxide or potassium hydroxide. HF or very dilute ammonium hydroxide are preferred because they will not roughen the surface. The oxide stripping may be done in the gas or liquid phase, but in the simplest application, it is done using aqueous HF. The feed wafer is thus substantially free of oxide or has less than approximately 4 angstroms of silicon oxide thereon.

Hydrogen termination of the feed wafer is preferably carried out in an Epi reactor. This can be done, for example, by depositing an epitaxial layer greater than 2 nm thick on the wafer, cooling the wafer from the deposition temperature to below 300° C. in hydrogen and then cooling to room temperature in air.

Following hydrogen termination, the wafer is subjected to treatment with an oxidant having a standard reduction potential less than approximately 1.77 volts, and preferably less than approximately 0.89 volt. The oxidant may be an acidified hydrogen peroxide or an oxygenated acid solution. Acidified hydrogen peroxide baths have a standard reduction potential of approximately 1.77 volts and oxygenated acid solutions or acidified solutions of oxygen have a standard reduction potential of 1.229 volts. The oxidation potential of the actual oxidizing species defines the TW0 signal or reading. Acidic and basic peroxide baths (SC1 and SC2) provide the same TW0 signal (see FIG. 1) because the HO2-species is the oxidant in both baths. In the acid bath, H2O2 is the stronger oxidant but is not kinetically available.

The oxidant mixture employed in the practice of the invention may be one of the following:

HCl/H2O2/H2O

HCl/O2/H2O citric acid/H2O2/H2O citric acid/O2/H2O acetic acid/H2O2/H2O acetic acid/O2/H2O phosphoric acid/H2O2/H2O phosphoric acid/O2/H2O sulfuric acid/H2O2/H2O sulfuric acid/O2/H2O Illustrative ratios for the components of the HCl/H2O2/H2O oxidant mixture are 1:4:50 and 1:1:5 while an illustrative ratio for the components of the citric acid/H2O2/H2O oxidant mixture is 1:1:5.

The oxygenated acid solution oxidant for use in the present invention may be an acid solution of an oxynitride such as nitrous acid or nitric acid or an oxyhalide such as hypochlorous acid, chlorous acid, chloric acid or hypoiodous acid. Some of these acids are commercially unavailable because of their instability and are made in situ as needed. It will be understood that other oxynitrides and oxyhalides and other oxidants having a standard reduction potential less than approximately 1.77 volts may also be used in the practice of the invention. The preferred chemical oxidants, H+/H2O2 and H+/O2 (from HCl/H2O2/H2O; HCl/O2/H2O; citric acid/H2O2/H2O; citric acid/O2/H2O), are non-etching oxidants. However, if a passivating oxide is already present on the wafer, they will not be able to further oxidize the surface. As previously indicated, the feed wafer going into these oxidants must therefore be essentially free of oxides or other passivating films. This is best accomplished as previously described by using a wafer with a freshly grown epitaxial silicon layer or that has been freshly stripped of oxide using an agent such as an aqueous HF soak.

The temperature of the oxidant baths and the concentration and ratio of the acid and oxidant may be varied to minimize chemical cost or processing time so long as at least approximately 8 angstroms of oxide are grown.

The process can be performed in any standard wet cleaning tool such as a cleaning tool made by Submicron Systems or Verteq. In an illustrative or typical process, the process sequence would be: 1) HF soak in 1% HF solution for 5 minutes; 2) rinse bath; 3) hydrogen termination; 4) oxidant bath for 5 minutes; 5) rinse bath; and 6) dryer for 5 minutes.

The following examples illustrate the practice of the invention.

EXAMPLE 1

A feed wafer having less than approximately 4 angstroms of silicon oxide thereon was subjected to hydrogen termination in an Epi reactor. The resulting wafer was then dipped in a bath containing 1:1:5 ratio of HCl/H2O2/H2O at 60° C. for >10 minutes. The resulting wafer had a TW0 of 86.1 (see FIG. 1).

EXAMPLE 2

A feed wafer having less than approximately 4 angstroms of silicon oxide thereon was subjected to hydrogen termination in an Epi reactor. The wafer was then oxidized in moist air (>35% relative humidity) for >48 hours. The resulting wafer had a TW0 of 27.1.

In view of the above, it will be seen that the several objects of the invention are achieved and other advantageous results attained.

As various changes could be made in the above process or method without departing from the scope of the invention, it is intended that all matter contained in the above description and shown in the accompanying drawing shall be interpreted as illustrative and not in a limiting sense.

What is claimed is:

1. A process for making a silicon wafer with low and uniform surface stress by growing at least approximately 8 angstroms of silicon oxide thereon to produce a wafer for use as a control wafer in ion implantation, which method comprises the steps of:

(a) subjecting a feed wafer substantially free of oxide or having less than approximately 4 angstroms of silicon oxide thereon to hydrogen termination of the silicon surface; or (b) subjecting such a feed wafer to said hydrogen termination followed by subjecting the resulting wafer to treatment with an oxidant having a standard reduction potential less than approximately 1.77 volts;

the wafer resulting from either step (a) or (b) having a TW0 reading less than approximately 30 across the entire wafer.

2. A process as set forth in claim 1 wherein said hydrogen termination in steps (a) or (b) is carried out in an Epi reactor.

3. A process as set forth in claim 1 wherein said feed wafer in steps (a) or (b) is a wafer with a freshly grown epitaxial layer or a wafer freshly stripped of oxide.

4. A process as set forth in claim 1 wherein said wafer resulting from step (a) or (b) has a TW0 reading less than approximately 20 across the entire wafer.

5. A process as set forth in claim 3 wherein said wafer freshly stripped of oxide is obtained by using an agent selected from the group consisting of aqueous HF, ammonium hydroxide and potassium hydroxide.

6. A process as set forth in claim 5 wherein said wafer freshly stripped of oxide is obtained by subjecting said wafer to an aqueous HF soak.

7. A process as set forth in claim 1 wherein said oxidant in step (b) has a standard reduction potential less than approximately 0.89 volt.

8. A process as set forth in claim 7 wherein said oxidant is an acidified hydrogen peroxide or an oxygenated acid solution.

9. A process as set forth in claim 8 wherein said oxygenated acid solution is an acid solution of an oxynitride or oxyhalide.

10. A process as set forth in claim 9 wherein said oxynitride is selected from the group consisting of nitrous acid and nitric acid.

11. A process as set forth in claim 9 wherein said oxyhalide is selected from the group consisting of hypochlorous acid, chlorous acid, chloric acid and hypoiodous acid.

12. A process as set forth in claim 1 wherein said oxidant is a mixture selected from the group consisting of (i)

HCl/H2O2/H2O; (ii) HCl/O2/H2O; (iii) citric acid/H2O2/H2O; (iv) citric acid/O2/H2O; (v) acetic acid/H2O2/H2O; (vi) acetic acid/O2/H2O; (vii) phosphoric acid/H2O2/H2O; (viii) phosphoric acid/O2/H2O; (ix) sulfuric acid/H2O2/H2O; and (x) sulfuric acid/O2/H2O.

13. A process as set forth in claim 12 wherein said oxidant mixture is HCl/H2O2/H2O in the ratio 1:4:50.

14. A process as set forth in claim 12 wherein said oxidant mixture is HCl/H2O2/H2O in the ratio 1:1:5.

15. A process as set forth in claim 12 wherein said oxidant mixture is citric acid/H2O2/H2O in the ratio 1:1:5.

16. A process for making a silicon wafer with low and uniform surface stress by growing at least approximately 8 angstroms of silicon oxide thereon to produce a wafer for use as a control wafer in ion implantation, said method comprising subjecting a feed wafer substantially free of oxide or having less than approximately 4 angstroms of silicon oxide thereon to hydrogen termination of the silicon surface to produce a wafer having a TW0 reading less than approximately 30 across the entire wafer.

17. A process as set forth in claim 16 wherein said hydrogen termination is carried out in an Epi reactor.

18. A process as set forth in claim 16 wherein said feed wafer is a wafer with a freshly grown epitaxial layer or a wafer freshly stripped of oxide.

19. A process as set forth in claim 18 wherein said wafer freshly stripped of oxide is obtained by using an agent selected from the group consisting of aqueous HF, ammonium hydroxide and potassium hydroxide.

20. A process as set forth in claim 19 wherein said wafer freshly stripped of oxide is obtained by subjecting said wafer to an aqueous HF soak.

21. A process as set forth in claim 16 wherein the wafer produced has a TW0 reading less than approximately 20 across the entire wafer.

22. A process for making a silicon wafer with low and uniform surface stress by growing at least approximately 8 angstroms of silicon oxide thereon to produce a wafer for use as a control wafer in ion implantation, said method comprising subjecting a feed wafer substantially free of oxide or having less than approximately 4 angstroms of silicon oxide thereon to hydrogen termination of the silicon surface followed by subjecting the resulting wafer to treatment with an oxidant having a standard reduction potential less than approximately 1.77 volts to produce a wafer having a TW0 reading less than approximately 30 across the entire wafer.

23. A process as set forth in claim 22 wherein said hydrogen termination is carried out in an Epi reactor.

24. A process as set forth in claim 22 wherein said feed wafer is a wafer with a freshly grown epitaxial layer or a wafer freshly stripped of oxide.

25. A process as set forth in claim 24 wherein said wafer freshly stripped of oxide is obtained by using an agent selected from the group consisting of aqueous HF; ammonium hydroxide and potassium hydroxide.

26. A process as set forth in claim 25 wherein said wafer freshly stripped of oxide is obtained by subjecting said wafer to an aqueous HF soak.

27. A process as set forth in claim 22 wherein the wafer produced has a TW0 reading less than approximately 20 across the entire wafer.

28. A process as set forth in claim 22 wherein said oxidant has a standard reduction potential less than approximately 0.89 volt.

29. A process as set forth in claim 28 wherein said oxidant is an acidified hydrogen peroxide or an oxygenated acid solution.

30. A process as set forth in claim 29 wherein said oxygenated acid solution is an acid solution of an oxynitride or oxyhalide.

31. A process as set forth in claim 30 wherein said oxynitride is selected from the group consisting of nitrous acid and nitric acid.

32. A process as set forth in claim 30 wherein said oxyhalide is selected from the group consisting of hypochlorous acid, chlorous acid, chloric acid and hypoiodous acid.

33. A process as set forth in claim 22 wherein said oxidant is a mixture selected from the group consisting of (i) HCl/H2O2/H2O; (ii) HCl/O2/H2O; (iii) citric acid/H2O2/H2O; (iv) citric acid/O2/H2O; (v) acetic acid/H2O2/H2O; (vi) acetic acid/O2/H2O; (vii) phosphoric acid/H2O2/H2O; (viii) phosphoric acid/O2/H2O; (ix) sulfuric acid/H2O2/H2O; and (x) sulfuric acid/O2/H2O.

* * * * *